(12) United States Patent
Chen (10) Patent No.: US 9,620,307 B2
(45) Date of Patent: Apr. 11, 2017

(54) KEYBOARD CIRCUIT EMPLOYING DIODES

(71) Applicant: Primax Electronics Ltd., Neihu, Taipei (TW)

(72) Inventor: Bo-An Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 11 days.

(21) Appl. No.: 14/867,322

(22) Filed: Sep. 28, 2015

(65) Prior Publication Data

US 2017/0032909 A1 Feb. 2, 2017

(30) Foreign Application Priority Data

Jul. 31, 2015 (TW) .............................. 104124920 A (51) Int. Cl.
*H01H 9/26* (2006.01)
*H01H 13/7065* (2006.01)

(52) U.S. Cl.
CPC ... *H01H 13/7065* (2013.01); *H01H 2205/002* (2013.01); *H01H 2211/00* (2013.01)

(58) Field of Classification Search
CPC .... G06F 3/0202; G06F 3/023; H01H 2239/01
USPC ............. 200/5 A, 512, 516, 517; 341/22, 26
See application file for complete search history.

(56) References Cited

U.S. PATENT DOCUMENTS

| | | | | |
|---|---|---|---|---|
| 4,628,408 A * | 12/1986 | Kimura | ................ | H01H 13/702 178/18.01 |
| 7,084,787 B2 * | 8/2006 | Olodort | ................ | G06F 1/1613 200/600 |
| 7,123,170 B1 * | 10/2006 | Iacob | ..................... | H03M 11/20 341/20 |
| 8,367,947 B2 * | 2/2013 | Tan et al. | .............. | G06F 3/0202 200/5 A |
| 8,502,094 B2 * | 8/2013 | Chen | ..................... | H01H 13/83 200/5 A |

* cited by examiner

*Primary Examiner* — Vanessa Girardi
(74) *Attorney, Agent, or Firm* — Kirton McConkie; Evan R. Witt (57) ABSTRACT

A keyboard includes plural keys, a membrane key switch module and plural diodes. The plural diodes are disposed on the membrane key switch module, and electrically connected with plural upper contacts or plural lower contacts of the membrane key switch module. Consequently, the keyboard has the function of avoiding the ghosting problem.

12 Claims, 6 Drawing Sheets

KEYBOARD CIRCUIT EMPLOYING DIODES

FIELD OF THE INVENTION

The present invention relates to a keyboard, and more particularly to a keyboard with an anti-ghosting function.

BACKGROUND OF THE INVENTION

Composite keys are widely used in many circumstances such as the word processing situation or the game playing situation. When plural keys of the composite key are simultaneously depressed, a specified function can be implemented. However, during the process of depressing the composite key, some problems may occur. For example, after two keys are depressed, the action of depressing the third key does not output any signal. This problem is also referred as a ghosting problem.

Conventionally, the keys of the keyboard are arranged in a keyboard matrix. When one key is depressed, a keyboard controller realizes the information of the depressed key according to the column information and the row information and outputs the corresponding signal. Generally, the intersection between each row and each column of the keyboard matrix represents a corresponding key. When one key is triggered, the keyboard starts to scan the keyboard matrix and recognizes which key is depressed. For example, the keyboard controller scans all columns of the keyboard matrix sequentially. If the corresponding signal is received from a specified row when a specified column is scanned by the keyboard controller, the keyboard controller can realize which key is depressed according to the column information and the row information of the closed loop.

The minimum rectangle unit of the keyboard matrix is composed of four keys. When any of the four keys is depressed, the signal can be successfully generated. When two of the four keys are arbitrarily depressed, the keyboard controller can realize which keys are triggered. However, when three keys are simultaneously depressed, two row information and two column information are transmitted to the keyboard controller. Since four keys are defined by two rows and two columns, the keyboard controller cannot recognize the three depressed keys from the four keys according to the row information and the column information only. Under this circumstance, the fourth key is erroneously judged as the on-state key. That is, the fourth key is referred as a ghost key.

When the ghost key exists, the keyboard controller cannot accurately judge which keys are depressed to generate the misjudged signals. For preventing the erroneous signal from being sent out, the keyboard controller may ignore the signal that is generated in response to the depressed third key. That is, only the signals corresponding to the earlier two keys are sent out. As mentioned above, if three keys at three of every four adjacent locations of the same matrix are simultaneously depressed, the ghosting problem occurs.

Since a membrane keyboard uses the keyboard matrix to judge the depressed key, the ghosting problem occurs. For avoiding the ghosting problem, the membrane keyboard is additionally equipped with a control IC that is implemented with a complex programmable logic device (CPLD). In addition, the key that is easily formed as the ghost key (e.g., one key of the composite key) has a novel circuitry design for avoiding occurrence of the ghost key. However, the above approaches need to develop the new design and cannot be directly applied to the commercially available membrane keyboard. Consequently, the cost and time in development are increased.

Therefore, there is a need of providing an improved membrane keyboard with a novel design to avoid the ghosting problem

SUMMARY OF THE INVENTION

An object of the present invention provides a keyboard having a function of avoiding the ghosting problem while saving cost and time.

In accordance with an aspect of the present invention, there is provided a keyboard. The keyboard includes plural keys, a membrane key switch module and plural diodes. The membrane key switch module is disposed under the plural keys. When the membrane key switch module is depressed by the plural keys, plural key signals are correspondingly generated. The membrane key switch module includes an upper wiring plate, a lower wiring plate and a spacer layer. The upper wiring plate includes plural upper contacts. The plural upper contacts are disposed on a bottom surface of the upper wiring plate. The lower wiring plate includes plural lower contacts. The plural lower contacts are disposed on a top surface of the lower wiring plate. The plural lower contacts are disposed under the corresponding upper contacts. When the plural lower contacts and the corresponding upper contacts are contacted with each other, the corresponding key signals are generated. The spacer layer is arranged between the upper wiring plate and the lower wiring plate. The plural upper contacts and the plural lower contacts are separated from each other by the spacer layer. The plural diodes are disposed on the bottom surface of the upper wiring plate. Each diode is electrically connected with one corresponding upper contact, so that a current is allowed to pass through the corresponding upper contact in one direction.

In accordance with another aspect of the present invention, there is provided a keyboard. The keyboard includes plural keys, a membrane key switch module and plural diodes. The membrane key switch module is disposed under the plural keys. When the membrane key switch module is depressed by the plural keys, plural key signals are correspondingly generated. The membrane key switch module includes an upper wiring plate, plural upper contacts, a lower wiring plate, plural lower contacts and a spacer. The plural upper contacts are disposed on a bottom surface of the upper wiring plate. The plural lower contacts are disposed on a top surface of the lower wiring plate, and disposed under the corresponding upper contacts. When the plural lower contacts and the corresponding upper contacts are contacted with each other, the corresponding key signals are generated. The spacer layer is arranged between the upper wiring plate and the lower wiring plate. The plural upper contacts and the plural lower contacts are separated from each other by a distance through the spacer layer. The plural diodes disposed on the top surface of the bottom wiring plate. Each diode is electrically connected with one corresponding upper contact, so that a current is allowed to pass through the corresponding lower contact in one direction.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Hereinafter, the keyboard of the present invention will be illustrated with reference to the following embodiments.

Figure 1:
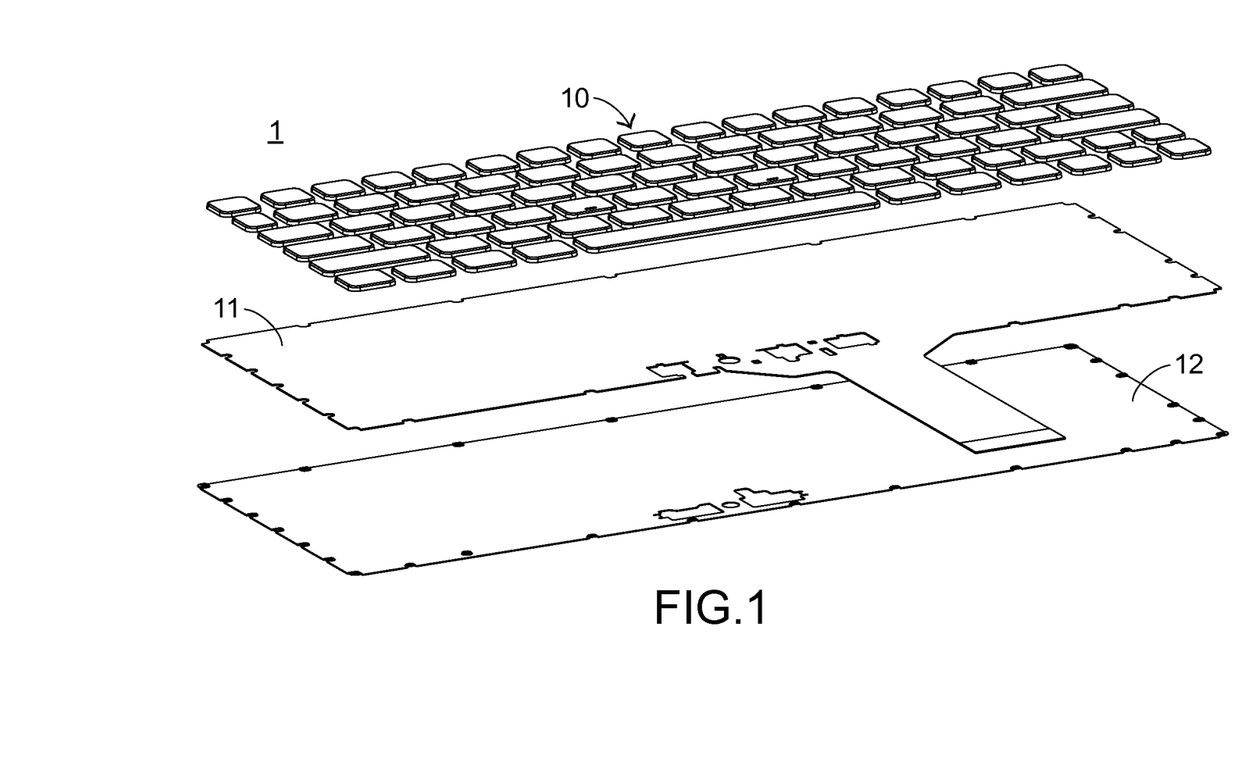
FIG. 1 is a schematic exploded view illustrating the entire of a keyboard according to a first embodiment of the present invention.
Figure 2:
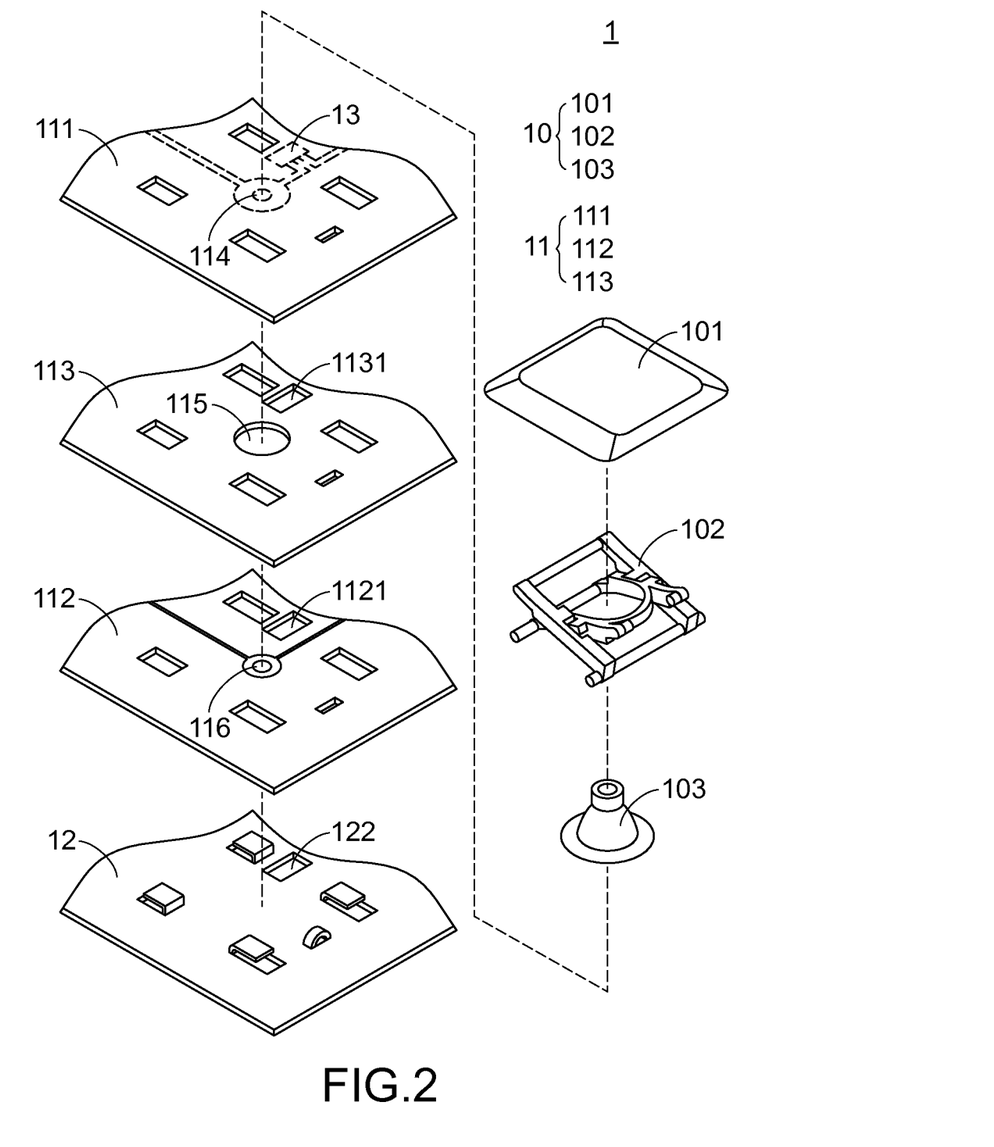
FIG. 2 is a schematic exploded view illustrating a portion of the keyboard according to the first embodiment of the present invention.
Figure 3:
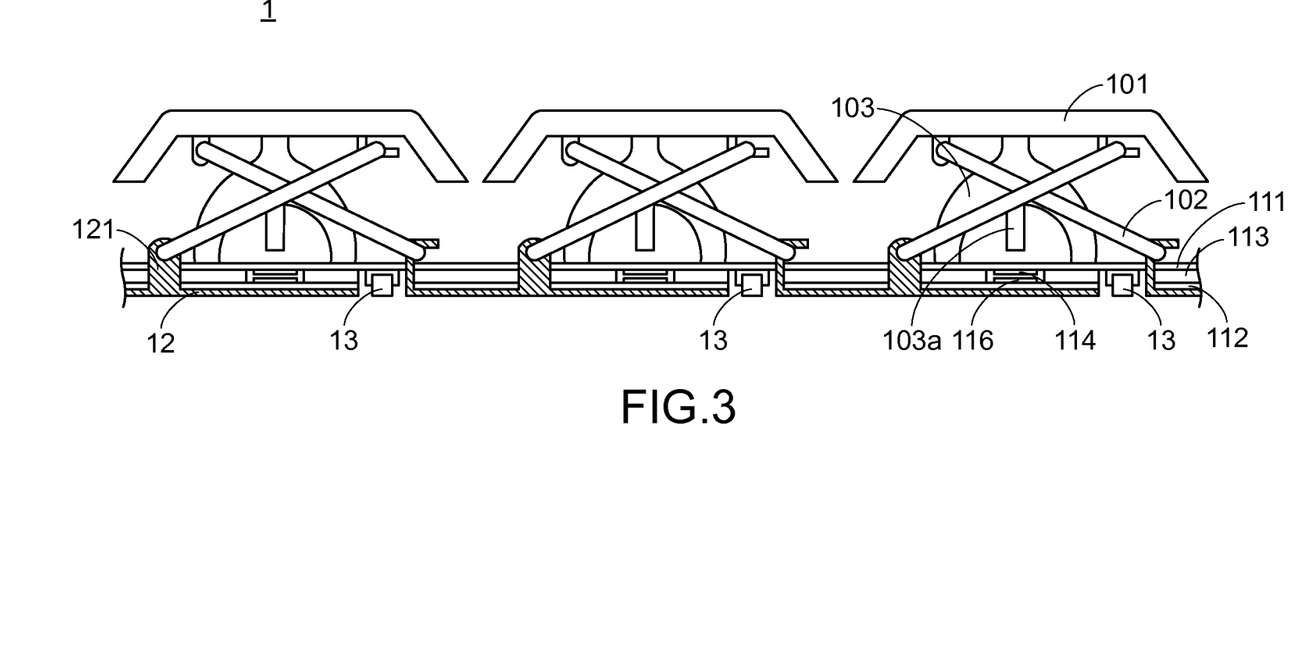
FIG. 3 is a schematic cross-sectional view illustrating a portion of the keyboard according to the first embodiment of the present invention.

Please refer to FIGS. 1, 2 and 3. FIG. 1 is a schematic exploded view illustrating the entire of a keyboard according to a first embodiment of the present invention. FIG. 2 is a schematic exploded view illustrating a portion of the keyboard according to the first embodiment of the present invention. FIG. 3 is a schematic cross-sectional view illustrating a portion of the keyboard according to the first embodiment of the present invention. For succinctness, only some keys and a portion of a membrane key switch module, a portion of a bottom plate and one diode under one key are shown in FIGS. 2 and 3.

First of all, the components of the keyboard 1 will be illustrated. As shown in FIGS. 1 and 2, the keyboard 1 comprises plural keys 10, a membrane key switch module 11, a bottom plate 12 and plural diode 13. Each key 10 comprises a keycap 101, a connecting element 102 and an elastic element 103. The membrane key switch module 11 comprises an upper wiring plate 111, a lower wiring plate 112 and a spacer layer 113. In FIG. 2, the constituents at a bottom surface of the upper wiring plate 111 are indicated as dotted lines. For example, plural upper contacts 114 that are connected with each other are disposed on the bottom surface of the upper wiring plate 111. The lower wiring plate 112 is disposed under the upper wiring plate 111. Moreover, plural lower contacts 116 that are contacted with each other are disposed on a top surface of the lower wiring plate 112. The spacer layer 113 is arranged between the upper wiring plate 111 and the lower wiring plate 112. The plural upper contacts 114 and the plural lower contacts 116 are separated from each other by the spacer layer 113. Moreover, the spacer layer 113 comprises plural perforations 115. Each upper contact 114 is aligned with a corresponding perforation 115 and a corresponding lower contact 116. In addition, each upper contact 114 and the corresponding lower contact 116 are collaboratively defined as a switch.

A process of assembling the keyboard 1 will be illustrated as follows. Firstly, as shown in FIGS. 2 and 3, the membrane key switch module 11 is arranged between the plural keys 10 and the bottom plate 12. The plural diodes 13 are disposed on the bottom surface of the upper wiring plate 111 of the membrane key switch module 11. In FIG. 2, one diode 13 denoted as dotted lines is shown. Moreover, each diode 13 is electrically connected with the corresponding upper contact 114. Consequently, the current flows through the upper contact 114 in one direction. The spacer layer 113 comprises plural first openings 1131. The lower wiring plate 112 comprises plural second openings 1121 under the corresponding first openings 1131. The bottom plate 12 comprises plural third openings 122 under the corresponding second openings 1121. Consequently, each diode 13 is accommodated within the corresponding first opening 1131, the corresponding second opening 1121 and the corresponding third opening 122. Due to the arrangement of the plural diodes 13, the function of avoiding the ghosting problem is achieved. The function of avoiding the ghosting problem will be described later.

Moreover, the plural elastic elements 103 are disposed on the top surface of the upper wiring plate 111, and connected with the corresponding keycaps 101. Each upper contact 114 is located under the corresponding elastic element 103. Moreover, each elastic element 103 has a protrusion part 103a. The protrusion part 103a is formed within the elastic element 103, and located over the corresponding upper contact 114. In some embodiments, the plural elastic elements 103 are individual components that are separately attached on the upper wiring plate 111. In some other embodiments, the plural elastic elements 103 are integrally formed as a single-piece component. The plural connecting elements 102 are also disposed on the top surface of the upper wiring plate 111, and connected with the corresponding keycaps 101. Moreover, each elastic element 103 is disposed within the accommodation space of the corresponding connecting element 102.

The bottom plate 12 comprises plural fixing structures 121. The plural fixing structures 121 are penetrated through the membrane key switch module 11 and protruded from the top surface of the upper wiring plate 111. Moreover, the plural fixing structures 121 are connected with the corresponding connecting elements 102. Consequently, the plural connecting elements 102 are fixed on the membrane key switch module 11. In the embodiment of FIG. 2, each connecting element 102 is connected with four fixing structures 121. It is noted that the number of the fixing structures 121 connected with each connecting element 102 may be varied according to the practical requirements.

After the above assembling process is completed, the keyboard 1 is assembled. In case that one of the keycaps 101 is pressed down, the connecting element 102 assists in stable downward movement of the keycap 101 so as to compress the elastic element 103. Consequently, the protrusion part 103a within the elastic element 103 is moved downwardly to press the upper wiring plate 111. Correspondingly, the upper contact 114 of the upper wiring plate 111 under the protrusion part 103a is inserted into the corresponding perforation 115 of the spacer layer 113 and contacted with the corresponding lower contact 116 of the lower wiring plate 112. Meanwhile, a corresponding key signal is generated. When the keycap 101 is no longer depressed, the connecting element 103 assists in stable upward movement of the keycap 101 in response to an elastic force provided by the elastic element 103. Consequently, the keycap 101 is returned to its original position where the keycap 101 is not depressed.

Figure 4:
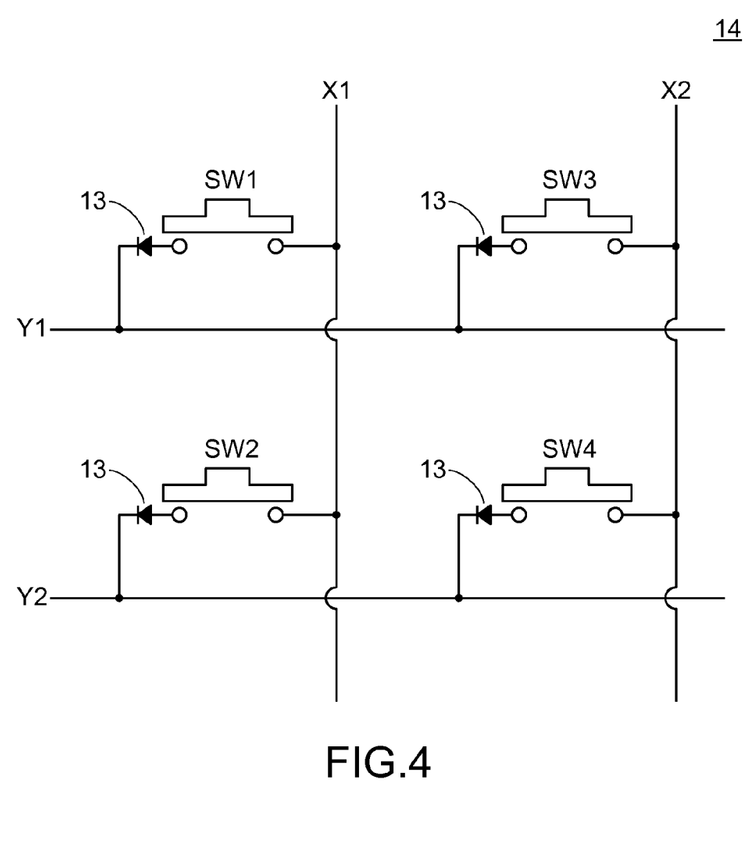
FIG. 4 is a schematic circuit diagram illustrating a keyboard matrix circuit of the keyboard according to the first embodiment of the present invention.

Hereinafter, the principles of avoiding the ghosting problem by arranging the plural diodes 14 in the keyboard 1 will be illustrated with reference to FIGS. 2, 3 and 4. FIG. 4 is a schematic circuit diagram illustrating a keyboard matrix circuit of the keyboard according to the first embodiment of the present invention. For succinctness, only a portion of the keyboard matrix circuit corresponding to four adjacent keys is shown in FIG. 4. The keyboard matrix circuit 14 comprises four switches SW1, SW2, SW3 and SW4, a first conductive line X1, a first conductive line X2, a second conductive line Y1 and a second conductive line Y2. The first conductive line X1 is electrically connected with the switches SW1 and SW2 along a vertical direction. The second conductive line X2 is electrically connected with the switches SW3 and SW4 along the vertical direction. The second conductive line Y1 is electrically connected with the switches SW1 and SW3 along a horizontal direction. The second conductive line Y2 is electrically connected with the switches SW2 and SW4 along the horizontal direction. A keyboard controller (not shown) will sequentially scan the first conductive lines X1 and X2. Moreover, while the keyboard controller scan the first conductive line X1 or X2, the keyboard controller judges whether the second conductive lines Y1 and Y2 are electrically conducted. According to the judging result, the keyboard controller can realize the on/off states of the switches SW1, SW2, SW3 and SW4. The detailed operations will be illustrated as follows.

As mentioned above, each upper contact 114 is aligned with the corresponding lower contact 116, and each upper contact 114 and the corresponding lower contact 116 are collaboratively defined as a switch. When the key 10 corresponding to a specified switch (e.g., the switch SW1) is depressed, the upper contact 114 and the lower contact 116 corresponding to the switch SW1 are in the on state. Consequently, the first conductive line X1 and the second conductive line Y1 are electrically conducted. That is, when the keyboard controller scans the first conductive line X1, the corresponding signal is received by the second conductive line Y1. Consequently, the keyboard controller can realize that the key 10 corresponding to the switch SW1 is depressed.

Similarly, when the key 10 corresponding to the switch SW2 is depressed, the switch SW2 is in the on state. Consequently, when the keyboard controller scans the first conductive line X1, the corresponding signal is received by the second conductive line Y2. Under this circumstance, the keyboard controller can realize that the key 10 corresponding to the switch SW2 is depressed. Similarly, when the key 10 corresponding to the switch SW3 is depressed, the switch SW3 is in the on state. Consequently, when the keyboard controller scans the first conductive line X2, the corresponding signal is received by the second conductive line Y1. Under this circumstance, the keyboard controller can realize that the key 10 corresponding to the switch SW3 is depressed. Similarly, when the key 10 corresponding to the switch SW4 is depressed, the switch SW4 is in the on state. Consequently, when the keyboard controller scans the first conductive line X2, the corresponding signal is received by the second conductive line Y2. Under this circumstance, the keyboard controller can realize that the key 10 corresponding to the switch SW4 is depressed.

Figure 5:
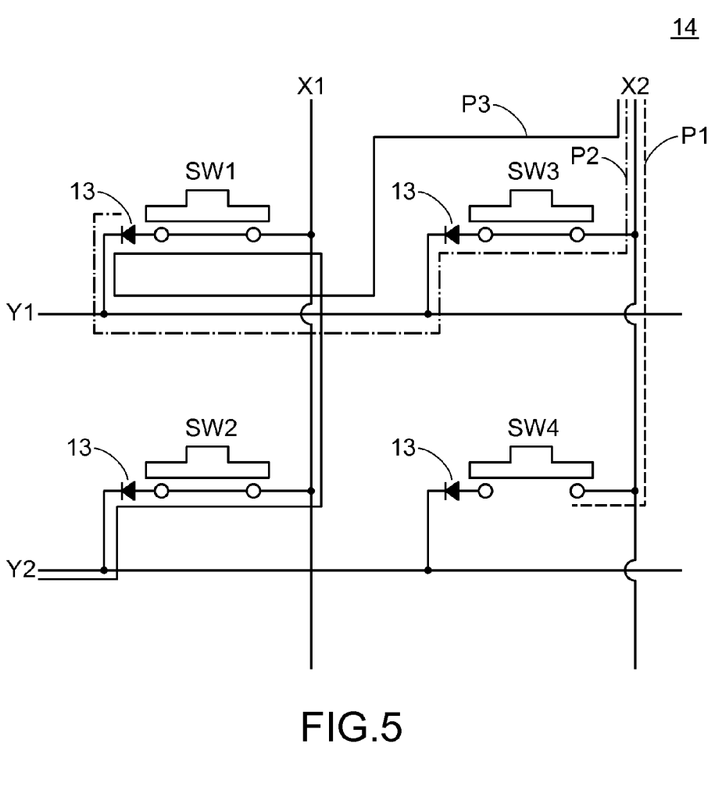
FIG. 5 is a schematic circuit diagram illustrating the current paths of the keyboard matrix circuit according to the first embodiment of the present invention.

If plural keys 10 are simultaneously depressed, the principles of using the plural diodes 13 to avoid the ghosting problem will be illustrated as follows. Please refer to FIGS. 4 and 5. FIG. 5 is a schematic circuit diagram illustrating the current paths of the keyboard matrix circuit according to the first embodiment of the present invention. As shown in FIG. 5, all of the switches SW1, SW2 and SW3 are in the on state because the corresponding keys are depressed. When the keyboard controller scans the first conductive line X2, the current along the path P1 cannot flow through the switch SW4 because the switch SW4 is in the off state. Moreover, since the switch SW1 is connected with the diode 13, the current is allowed to flow through the switch SW1 in one direction. That is, the current along the path P2 cannot flow through the switch P2. Since the keyboard controller cannot receive the corresponding signal from the second conductive line Y2, the keyboard controller can accurately judge that the key 10 corresponding to the switch SW4 is not depressed. Under this circumstance, the ghosting problem is avoided. Whereas, in case that the switch SW1 is not connected with the diode 13, the ghosting problem occurs. For example, when the keyboard controller scans the first conductive line X2, the current reversely flows through the switch SW1 along the path P3. Consequently, the keyboard controller receives the corresponding signal from the second conductive line Y2. Under this circumstance, the keyboard controller may misjudge that the key 10 corresponding to the switch SW4 is depressed. Under this circumstance, the ghosting problem occurs.

Similarly, in case that the keys 10 corresponding to the switches SW2, SW3 and SW4 are depressed, these switches are in the on state. Since the switch SW4 is connected with the diode 13, the current is allowed to flow through the switch SW4 is in one direction. Since the switches SW2, SW3 and SW4 cannot provide another conduction path, the first conductive line X1 and the second conductive line Y1 are not electrically conducted. Under this circumstance, the keyboard controller will not misjudge that the key 10 corresponding to the switch SW1 is depressed. Under this circumstance, the ghosting problem is avoided.

Similarly, in case that the keys 10 corresponding to the switches SW1, SW3 and SW4 are depressed, these switches are in the on state. Since the switch SW3 is connected with the diode 13, the current is allowed to flow through the switch SW3 is in one direction. Since the switches SW1, SW3 and SW4 cannot provide another conduction path, the first conductive line X1 and the second conductive line Y2 are not electrically conducted. Under this circumstance, the keyboard controller will not misjudge that the key 10 corresponding to the switch SW2 is depressed. Under this circumstance, the ghosting problem is avoided.

Similarly, in case that the keys 10 corresponding to the switches SW1, SW2 and SW4 are depressed, these switches are in the on state. Since the switch SW2 is connected with the diode 13, the current is allowed to flow through the switch SW2 is in one direction. Since the switches SW1, SW2 and SW4 cannot provide another conduction path, the first conductive line X2 and the second conductive line Y1 are not electrically conducted. Under this circumstance, the keyboard controller will not misjudge that the key 10 corresponding to the switch SW3 is depressed. Under this circumstance, the ghosting problem is avoided.

In the above embodiments, each switch is connected to one diode 13. It is noted that numerous modifications and alterations may be modified while retaining the teachings of the present invention. For example, if only the switches SW1, SW2 and SW3 of the four switches SW1, SW2, SW3 and SW4 are allowed to be simultaneously depressed to define a composite key, the connection between the switch SW1 and the corresponding diode 13 can avoid the ghosting problem. That is, even if only one switch of the four adjacent switches is connected with the diode, the ghosting problem can be avoided From the above embodiments, the uses of the plural diodes 13 can avoid the ghosting problem. Moreover, since the plural diodes 13 are disposed on the bottom surface of the upper wiring plate 111 of the membrane key switch module 11 and electrically connected with the respective upper contacts 114, the keyboard matrix circuit can be directly applied to the current membrane keyboard without the need of changing the current design of the membrane keyboard. That is, the keyboard of the present invention can avoid the ghosting problem in a cost-saving and time-saving manner. Moreover, the plural diodes 13 are accommodated within the stack structure of the keyboard 1. That is, the plural diodes 13 can be accommodated within the spacer layer 113, the lower wiring plate 112 and the bottom plate 12. Since it is not necessary to use an additional accommodation space to accommodate the plural diodes 13, the overall thickness of the keyboard 1 is not increased.

Figure 6:
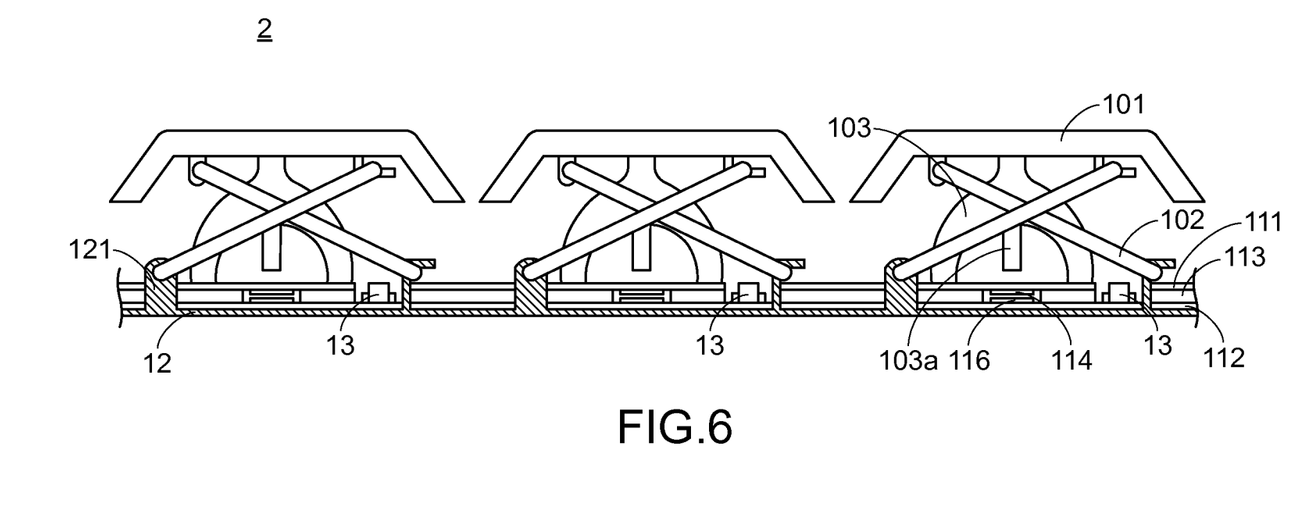
FIG. 6 is a schematic cross-sectional view illustrating a keyboard according to a second embodiment of the present invention.

Hereinafter, another possible variant example of the keyboard will be illustrated with reference to a keyboard 2 a second embodiment of the present invention. Please refer to FIG. 6. FIG. 6 is a schematic cross-sectional view illustrating a keyboard according to a second embodiment of the present invention.

In comparison with the first embodiment, the plural diodes of this embodiment are disposed on the top surface of the lower wiring plate 112 of the membrane key switch module 11. Moreover, in this embodiment, each diode 13 is electrically connected with one corresponding lower contact 116. Consequently, the current is allowed to flow through the corresponding lower contact 116 is in one direction. Likewise, the keyboard 2 of this embodiment can avoid the ghosting problem. Consequently, the keyboard matrix circuit can be directly applied to the current membrane keyboard without the need of changing the current design of the membrane keyboard. That is, the keyboard of the present invention can avoid the ghosting problem in a cost-saving and time-saving manner. The other structures and the operating principles of the keyboard 2 are similar to those of the keyboard 1 of the first embodiment, and are not redundantly described herein.

From the above embodiments, the uses of the plural diodes can avoid the ghosting problem of the keyboard. Moreover, since the plural diodes are disposed within the membrane key switch module, the keyboard matrix circuit can be directly applied to the current membrane keyboard without the need of changing the current design of the membrane keyboard. That is, the keyboard of the present invention can avoid the ghosting problem in a cost-saving and time-saving manner. Moreover, the overall thickness of the keyboard is not increased. In other words, the keyboard of the present invention is industrially applicable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A keyboard, comprising:
   plural keys;
   a membrane key switch module disposed under the plural keys, wherein when the membrane key switch module is depressed by the plural keys, plural key signals are correspondingly generated, wherein the membrane key switch module comprises:
   an upper wiring plate comprising plural upper contacts, wherein the plural upper contacts are disposed on a bottom surface of the upper wiring plate;
   a lower wiring plate comprising plural lower contacts, wherein the plural lower contacts are disposed on a top surface of the lower wiring plate, and the plural lower contacts are disposed under the corresponding upper contacts, wherein when the plural lower contacts and the corresponding upper contacts are contacted with each other, the corresponding key signals are generated; and
   a spacer layer arranged between the upper wiring plate and the lower wiring plate, wherein the plural upper contacts and the plural lower contacts are separated from each other by the spacer layer; and
   plural diodes disposed on the bottom surface of the upper wiring plate, wherein each diode is electrically connected with one corresponding upper contact, so that a current is allowed to pass through the corresponding upper contact in one direction.

2. The keyboard according to claim 1, wherein a number of the plural upper contacts and a number of the plural diodes are equal.

3. The keyboard according to claim 1, wherein in every four adjacent upper contacts, only one upper contact is electrically connected with the corresponding diode.

4. The keyboard according to claim 1, wherein each upper contact and the corresponding lower contact under the upper contact are collaboratively defined as a switch, wherein the membrane key switch module comprises plural first conductive lines and plural second conductive lines, wherein the plural first conductive lines are electrically connected with the corresponding switches along a vertical direction and electrically connected with the corresponding diodes which are connected with the corresponding switches, wherein the plural second conductive lines are electrically connected with the corresponding switches along a horizontal direction and electrically connected with the corresponding diodes which are connected with the corresponding switches.

5. The keyboard according to claim 1, wherein the spacer layer comprises plural first openings, and the lower wiring plate comprises plural second openings under the corresponding first openings, wherein the plural diodes are accommodated within the corresponding first openings and the corresponding second openings.

6. The keyboard according to claim 1, wherein the spacer layer comprises plural perforations, wherein when the membrane key switch module is depressed, the plural upper contacts are inserted into the corresponding perforations and contacted with the corresponding lower contacts, so that the plural key signals are generated.

7. The keyboard according to claim 1, further comprising a bottom plate, wherein the bottom plate is disposed under the membrane key switch module, and the membrane key switch module and the plural keys are supported by the bottom plate, wherein the bottom plate comprises plural third openings, and the plural diodes are accommodated within the corresponding third openings.

8. The keyboard according to claim 1, wherein each of the plural keys comprises:
   a keycap;
   a connecting element arranged between the keycap and the membrane key switch module, and connected with the keycap, wherein the keycap is movable upwardly and downwardly relative to the membrane key switch module through the connecting element; and
   an elastic element arranged between the keycap and the membrane key switch module, and providing an elastic force to the keycap, wherein the keycap is returned to an original position in response to the elastic force.

9. A keyboard, comprising:
   plural keys;
   a membrane key switch module disposed under the plural keys, wherein when the membrane key switch module is depressed by the plural keys, plural key signals are correspondingly generated, wherein the membrane key switch module comprises:
- an upper wiring plate;
- plural upper contacts disposed on a bottom surface of the upper wiring plate;
- a lower wiring plate;
- plural lower contacts disposed on a top surface of the lower wiring plate, and disposed under the corresponding upper contacts, wherein when the plural lower contacts and the corresponding upper contacts are contacted with each other, the corresponding key signals are generated; and
- a spacer layer arranged between the upper wiring plate and the lower wiring plate, wherein the plural upper contacts and the plural lower contacts are separated from each other by a distance through the spacer layer; and plural diodes disposed on the top surface of the bottom wiring plate, wherein each diode is electrically connected with one corresponding upper contact, so that a current is allowed to pass through the corresponding lower contact in one direction.

10. The keyboard according to claim 9, wherein each lower contact is electrically connected with one corresponding diode.

11. The keyboard according to claim 9, wherein in every four adjacent lower contacts, only one lower contact is electrically connected with the corresponding diode.

12. The keyboard according to claim 9, wherein the membrane key switch module comprises plural first conductive lines and plural second conductive lines, wherein the plural first conductive lines are electrically connected with the corresponding lower contacts along a horizontal direction, electrically connected with the corresponding diodes which are connected with the corresponding lower contacts and electrically connected with the upper contacts over the corresponding lower contacts, wherein the plural second conductive lines are electrically connected with the corresponding lower contacts along a vertical direction, electrically connected with the corresponding diodes which are connected with the corresponding lower contacts and electrically connected with the upper contacts over the corresponding lower contacts.

* * * * *